Oct. 28, 1969 SABURO IWATA ET AL 3,475,661

SEMICONDUCTOR DEVICE INCLUDING POLYCRYSTALLINE
AREAS AMONG MONOCRYSTALLINE AREAS

Filed Feb. 6, 1967

INVENTORS
Saburo Iwata
Akira Misawa

BY Hill, Sherman, Meroni, Gross & Simpson
ATTORNEYS 3,475,661

SEMICONDUCTOR DEVICE INCLUDING POLYCRYSTALLINE AREAS AMONG MONOCRYSTALLINE AREAS

Saburo Iwata, Tokyo, and Akira Misawa, Kanagawa-ken, Japan, assignors to Sony Corporation, Shinagawa-ku, Tokyo, Japan, a corporation of Japan Filed Feb. 6, 1967, Ser. No. 614,160
Claims priority, application Japan, Feb. 9, 1966, 41/7,871
Int. Cl. H01l *3/00, 5/00, 11/00*
U.S. Cl. 317—234 12 Claims

ABSTRACT OF THE DISCLOSURE

A semiconductor device having a plurality of electrical elements thereon which are electrically isolated by a PN junction, the device including a substrate of one conductivity type and an epitaxial layer of the other conductivity type thereover, the epitaxial layer including polycrystalline areas through which an impurity is diffused to provide the isolating PN junction.

BACKGROUND OF THE INVENTION

This invention deals with semiconductor devices including multiple elements thereon such as variable capacitance diodes and/or integrated circuits.

DESCRIPTION OF THE PRIOR ART

While multiple element semiconductor devices of the same general type as hereinvolved have been known in the prior art, such prior art devices have various defects, particularly in the amount of voltage which they could withstand, and in the difficulty of manufacture. For example, in the prior art techniques, it was usually necessary to use either a diffusion mask for diffusing impurities into a substrate or they required photographic type processes involving the use of resist materials.

SUMMARY OF THE INVENTION

The present invention deals with a semiconductor device which includes a substrate of one conductivity type, an epitaxial layer of the opposite conductivity type formed on the substrate, the epitaxial layer including single crystal portions and polycrystalline portions. Isolation between the various sections of the semiconductor device is achieved by providing a diffused region along the polycrystalline portions which provide PN junctions between the polycrystalline portions and the single crystal portions.

In the process of the present invention, the substrate is provided with seeding sites for polycrystalline layer development. Then, an epitaxial layer of the opposite conductivity type is vacuum-deposited onto the substrate. At the seeding sites, the polycrystalline layer is developed, whereas in the remaining portion of the layer, the epitaxial layer is essentially a single crystal.

DESCRIPTION OF THE PREFERRED EMBODIMENTS

Figure 1:
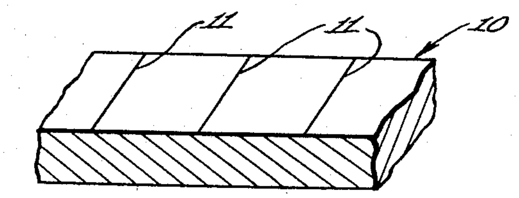
FIGURE 1 is a view in perspective of a substrate which can be used according to the present invention.

In FIGURE 1, reference numeral 10 indicates generally a P-type single crystal silicon substrate having a plurality of continuous or discontinuous grooves 11 formed on one face thereof. The grooves 11 act as sites for growing subsequently applied polycrystalline layers. An N-type silicon epitaxial layer 12 is then deposited over the grooved surface by means of vapor deposition. The grooves 11 cause the N-type silicon to be deposited as polycrystalline regions 13 which grow into a generally wedge shape. The remainder of the layer 12 is a single crystal layer of N-type silicon.

Epitaxial growth processes are well known in the art and provide an extension of the original crystalline structure of the substrate, with the atoms of the epitaxial layer being aligned as a continuation of the original crystalline structure. In a typical epitaxial growth process, the substrate is heated in a reaction chamber and a gas stream containing vapors of a silicon halide such as silicon tetrachloride doped with a small amount of phosphorous trichloride is passed over the heated substrate in the chamber under vacuum conditions. A reaction takes place at the surfaces, and a film or layer of silicon grows in monocrystalline form on the surface of the substrate. The impurity material also deposits in elemental form along with the silicon on the substrate.

Following the deposition of the epitaxial layer 12, the substrate is heated to diffuse the P-type impurity from the substrate 10 into the epitaxial layer 12. The acceptor impurity contained in the substrate 10 diffuses into the polycrystalline areas 13 more rapidly than in the single crystal area so that a diffused area 14 substantially surrounding the wedge-shaped polycrystalline areas 13 is produced, the diffused area 14 providing PN junctions between the single crystal area 12 and the substrate 10. The PN junction is substantially uniform in thickness, both at the region where it is parallel to the substrate 10 and the region overlying the wedge-shaped polycrystalline areas 13.

Sites for the production of polycrystalline areas as part of an epitaxial growth process can also be provided by depositing a layer of silica on the substrate instead of providing grooves. The silica particles provide discontinuities which behave in substantially the same manner as the grooves 11 shown in the figures.

Figure 2:
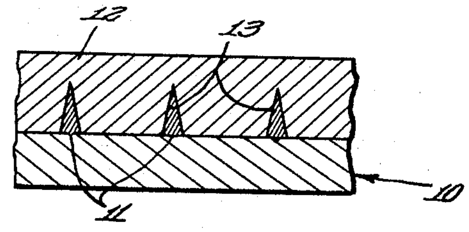
FIGURE 2 is a greatly enlarged cross-sectional view of the semiconductor device after the polycrystalline areas and the single crystal areas have been applied to the substrate.
Figure 4:
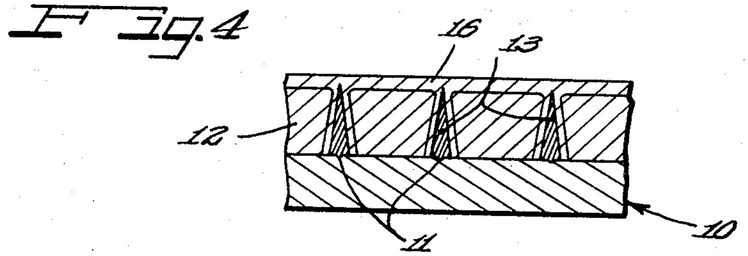
FIGURE 4 is a view similar to FIGURE 3 but illustrating a modified form of diffusion process which can be employed.

In the form of the invention shown in FIGURE 4, the steps of FIGURES 1 and 2 are repeated, whereby polycrystalline areas 13 of generally wedge shape are provided within a single crystal layer of epitaxially grown section 12. In this embodiment, however, instead of diffusing the impurity from the substrate 10, an acceptor impurity is diffused into the epitaxial layer 12 through the epitaxial layer itself thereby forming a diffused zone 16 surrounding the polycrystalline areas 13 and thereby providing PN junctions.

Figure 3:
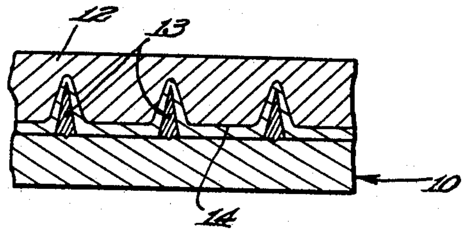
FIGURE 3 is a view similar to FIGURE 2 but illustrating the components after diffusion of an impurity resulting in the formation of PN junctions.

The device in FIGURE 3 can be made into a variable capacitance diode by providing electrodes on the upper and lower surfaces thereof. The capacitance of the resulting diode can be predetermined by preselecting the depth or width of the grooves 11 in the substrate. Furthermore, the geometry of the device is such that the diode is able to withstand higher voltages than similar diodes previously used.

Figure 5:
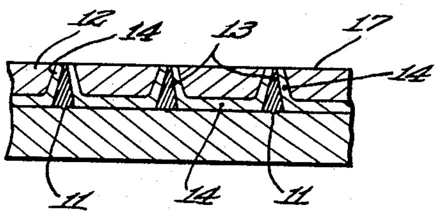
FIGURE 5 is a greatly enlarged view of a modified form of a semiconductor device produced according to the present invention.

FIGURE 5 illustrates the production of an integral circuit semiconductor device using the process of the present invention. In the manufacture of the integral circuit of FIGURE 5, the steps of FIGURES 1 through 3 are repeated after which the upper surface of the device is planed or otherwise cut to provide a surface 17 in which portions of the polycrystalline area 13 are exposed. Alternatively, the epitaxial layer 12 can be grown originally so that the upper ends of the polycrystalline area 13 extend up to the surface of the single crystal layer 12, i.e., the depth of deposition of the epitaxial layer 12 can be controlled so that it does not exceed the height of the polycrystalline area 13.

In the device of FIGURE 5, the single crystal epitaxial layers 12 are electrically separated from each other by PN junctions 14 so that the individual areas 12 can each provide circuit elements such as transistors, diodes, capacitors or resistances.

The improved elements of the present invention can also be made by other modified techniques, e.g., starting with a substrate of P-type silicon, an epitaxial layer of P-type silicon can be deposited on the substrate, with the formation of polycrystalline areas as previously described. Then, a donor impurity can be diffused through the substrate and through the polycrystalline areas to form individual epitaxial areas which are separated from the polycrystalline areas by PN junctions.

As a further modified form of the invention, an intrinsic silicon substrate can be provided with an epitaxial layer of P-type silicon with intermediate polycrystalline areas. Then, the donor impurity can be diffused through the epitaxial layer to form diffused areas which provide PN junctions between the polycrystalline areas and the P-type epitaxial layer.

It should be evident that various other modifications can be made to the described embodiments without departing from the scope of the present invention.

We claim as our invention:

1. A semiconductor device comprising a substrate of one conductivity type, means on said substrate providing discontinuities in the surface thereof, a layer of the opposite conductivity type formed on said substrate and constituting an extension of the original crystalline structure of said substrate, said layer including spaced polycrystalline portions over said discontinuities, and a diffused region along said polycrystalline portions providing PN junctions between said polycrystalline portions and said layer.

2. The device of claim 1 in which said diffused region contains the same impurity as exists in said substrate.

3. The device of claim 1 in which said polycrystalline portions are surrounded by said diffused region.

4. The device of claim 1 in which said polycrystalline portions extend upwardly to and are exposed at the surface of said layer.

5. A semiconductor device as claimed in claim 1 wherein said discontinuities are provided by a layer of silica formed on said substrate.

6. The method of making a semiconductor device which comprises providing a substrate of one conductivity type, forming surface discontinuities for polycrystalline layer development on said substrate, vacuum depositing an epitaxial layer of the opposite conductivity type onto said substrate to thereby form polycrystalline layers on said discontinuities separated by single crystal layers, and diffusing an impurity through said polycrystalline layers to form PN junctions.

7. The method of claim 6 in which said impurity is diffused from within said substrate.

8. The method of claim 6 in which said impurity is diffused through said epitaxial layer.

9. The method of claim 6 in which the device is severed along the epitaxial layer after the formation of said junctions to expose portions of said polycrystalline layers.

10. A semiconductor device as claimed in claim 1 wherein said discontinuities are provided by grooves formed on said substrate.

11. The method of claim 6 wherein said discontinuities are formed by grooving said substrate.

12. The method of claim 6 wherein said discontinuities are formed by forming a layer of silica on said substrate.

References Cited

UNITED STATES PATENTS

| | | | |
|---|---|---|---|
| 3,189,973 | 6/1965 | Edwards et al. | 29—25.3 |
| 3,375,418 | 3/1968 | Garnache et al. | 317—235 |
| 3,335,038 | 9/1967 | Doo | 148—175 |
| 3,327,182 | 6/1967 | Kisinko | 317—235 |
| 3,370,980 | 2/1968 | Anderson. | |

OTHER REFERENCES

Electronics Review, vol. 37, No. 17, Jan. 1, 1964, page 23 relied on.

JOHN W. HUCKERT, Primary Examiner
M. EDLOW, Assistant Examiner

U.S. Cl. X.R.

317—235; 148—186, 176